United States Patent [19]

Torazzina

[11] Patent Number: 4,983,927
[45] Date of Patent: Jan. 8, 1991

[54] INTEGRATED AUDIO AMPLIFIER WITH COMBINED REGULATION OF THE "MUTE" AND "STANDBY" FUNCTIONS AND THE SWITCHING TRANSIENTS

[75] Inventor: Aldo Torazzina, Monza, Italy

[73] Assignee: SGS-Thomson Microelectronics SrL, Agrate Brianza, Italy

[21] Appl. No.: 428,516

[22] Filed: Oct. 30, 1989

[30] Foreign Application Priority Data

Nov. 9, 1988 [IT] Italy .................................. 22556 A/88

[51] Int. Cl.$^5$ ............................................. H03F 3/30
[52] U.S. Cl. ....................................... 330/51; 330/267
[58] Field of Search ................. 330/51, 202, 203, 267, 330/273, 296, 297

[56] References Cited

U.S. PATENT DOCUMENTS 4,546,327 10/1985 Suzuki et al. ..................... 330/51 X

FOREIGN PATENT DOCUMENTS 111307 9/1981 Japan ..................................... 330/51
153407 9/1983 Japan ..................................... 330/51

Primary Examiner—James B. Mullins
Attorney, Agent, or Firm—Wenderoth, Lind & Ponack

[57] ABSTRACT

An integrated audio amplifier with combined regulation of the "mute" and "standby" functions and the switching transients, is configured so that the "mute" and "standby" states are compulsory transitional states between a state of normal operation and a cut-off state. The amplifier includes an amplifier circuit and three threshold comparators each having an input terminal connected to a common circuit node. The comparators regulate the biasing of the amplifier circuit and the transmission of signals therethrough in accordance with the common circuit node voltage.

12 Claims, 1 Drawing Sheet

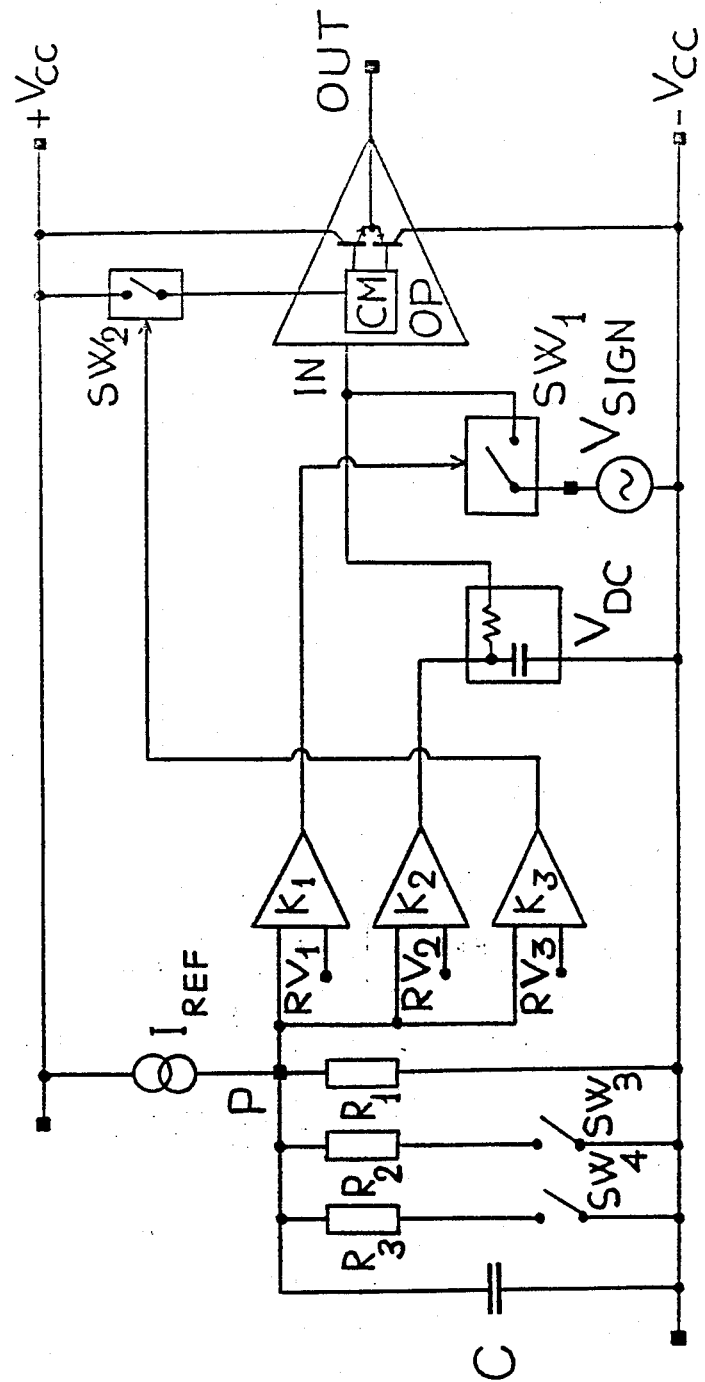

INTEGRATED AUDIO AMPLIFIER WITH COMBINED REGULATION OF THE "MUTE" AND "STANDBY" FUNCTIONS AND THE SWITCHING TRANSIENTS

BACKGROUND OF THE INVENTION

The present invention relates to audio amplifiers and in particular to audio amplifiers which can be placed in a mute state or a standby state with a low consumption of electrical energy.

With the introduction of modern audio apparatus with a high-level performance for "high-fidelity" applications, for example, for television sets and for car radios, constructed essentially using integrated circuits, great care has been taken to prevent annoying noise which can be heard by the human ear ("crackles") due to the switching transients of the electronic components, not only during the stages of switching on and switching off, but also during the transitions from a state of normal operation to a mute state or a standby state with low power consumption.

As is known, an operative mute state, usually defined in the technical literature by the term "mute", is generally set from outside using an appropriate control when the user wishes to stop the output of sounds from the loudspeaker connected to the amplifier for only a short period of time.

In order to obtain a "mute" state it is sufficient to prevent the transfer of audio signals to the loudspeaker, while continuing normally to supply the audio amplifier.

The "mute" state can also be automatically set, by appropriate circuits in the audio apparatus, for predetermined time periods during the turn-on or turn-off transients of the audio apparatus so as to eliminate the transfer of noise generated upstream of the audio amplifier connected to the loudspeaker as an output to the loudspeaker.

Even if the "mute" state is set by a circuit contained within the audio amplifier, it cannot, however, be used to eliminate noise generated in the audio amplifier itself which is essentially due to the instability of power output stage during the switching transients.

A low power consumption standby state, usually defined in the technical literature by the term "standby", is that state in which the greatest possible number of components of an audio apparatus and in particular its audio amplifier are placed in a disabled or cut-off condition, while the connections to the power supply are maintained.

Only those components absolutely necessary for re-setting the normal functions of the other components when the "standby" state is discontinued remain in operation.

A "standby" state is generally set externally by the user by means of an appropriate control, but may also be set automatically to provide forms of protection, for instance in cases of overloading, until the abnormal operating conditions are removed.

At present the technical solutions used for the initiation of a "standby" state are separate from those used for the initiation of a "mute" stage and separate circuits are used.

As regards the problem of the noise caused by the switching transients, the technical solutions used in modern integrated circuit audio apparatus are separate depending on whether this noise is generated upstream of the audio amplifier or in the audio amplifier itself and in particular in its power output stage.

In the first case, as has been noted, a "mute" state having a limited duration of time can be effectively used only during the time periods of the switching transients in which the noise may be generated.

In the second case, use is made of circuit devices of the type disclosed, for instance, in U.S. Pat. No. 4,371,841 to Eckert et al., which are designed to suppress the switching transients of the components operating along the signal path.

SUMMARY OF THE INVENTION

The object of the present invention is to provide an audio amplifier which can be monolithically integrated, in which the achievement of the "mute" and "standby" functions and the elimination of the audio noise caused by switching transients is carried out in a more economical and effective way than in the known solutions, using the same circuit arrangement.

This object is achieved by providing an audio amplifier comprising:

an amplifier circuit means having at least one input terminal and an output terminal and including a bias circuit means;

a signal source input means for receiving an input audio signal to be amplified by the audio amplifier, said signal source input means being coupled to said at least one input terminal of said amplifier circuit means;

a control means having at least three states;

a voltage generator means, coupled to said control means, and having an output terminal comprising a control node;

a comparing means having an input terminal connected to said control node and having first, second and third output terminals;

a bias voltage generator means having an input terminal coupled to said second output terminal of said voltage generator means and having an output terminal coupled to said at least one input terminal of said amplifier circuit means, said bias voltage generator means substantially integrating a potential at its input terminal such that a potential at its output terminal gradually changes to a value substantially proportional to that potential at its input terminal after a predetermined period of time;

a supply voltage source means for providing a supply voltage to the audio amplifier;

a first switch means for connecting said signal source input means and said at least one input terminal of said amplifier circuit means and having a control terminal connected to said first output terminal of said comparing means, said first switch means selectively connecting and disconnecting said signal source input means to said amplifier circuit means in accordance with a potential at its control terminal;

a second switch means for connecting said supply voltage source means to said bias circuit means of said amplifier circuit means and having a control terminal connected to said third output terminal of said comparing means, said second switch means selectively connecting and disconnecting said supply voltage source means to said bias circuit means of said amplifier circuit means in accordance with a potential at its control terminal;

wherein said at least three states of said control means includes a first, normal, state in which a first voltage potential is present at said first, second and third output terminals of said comparing means, such that said signal source input means is connected to said at least one input terminal of said amplifier circuit means via said first switch means and said supply voltage source means is connected to said bias circuit means of said amplifier circuit means via said second switch means and an output voltage is provided from said bias voltage generator means after a predetermined period of time; and wherein said at least three states of said control means includes a second, mute, state in which said second and third output terminals of said comparing means remain at said first potential while said first output terminal of said comparing means is at a second potential which is different from said first potential such that said first switch means disconnects said signal source input means from said at least one input terminal of said amplifier circuit means, thereby muting the amplifier; and wherein said three states of said control means includes a third, standby, state in which said first and second and third outputs of said comparing means are at said second potential, such that said signal source input means is disconnected from said at least one input of said amplifier circuit means by said first switch means and said supply voltage source means is disconnected from said bias circuit means of said amplifier circuit means by said second switch means and said bias voltage generator means changes said potential at its output terminal to a value proportional to said second potential after a predetermined period of time;

said voltage generator means and control means and comparing means being arranged such that transitions between said at least three states of said control means occur gradually.

BRIEF DESCRIPTION OF THE DRAWINGS

The invention is set out in further detail in the following detailed description, given purely by way of non-limiting example, with reference to the attached drawing which shows a circuit diagram, partly in block form, of a preferred embodiment of an audio amplifier in accordance with the present invention.

DESCRIPTION OF THE PREFERRED EMBODIMENT

An audio amplifier in accordance with the present invention comprises an amplifier circuit OP, shown in the drawing figure by a triangular block disposed between a first terminal +Vcc and a second terminal −Vcc of a supply.

A power output stage, formed by two transistors in "push-pull" and having an output terminal which is the output terminal OUT of the amplifier circuit OP, is shown diagrammatically within the amplifier circuit block.

A load (not shown), for example, a loudspeaker, is connected to the output terminal OUT via a capacitive component.

A biasing circuit for the power output stage and other components of the amplifier circuit itself are also shown in the block OP by a block CM. The details of such a biasing circuit and other components are known to those skilled in the art as evidenced by the circuits discussed in detail in U.S. Pat. Nos. 4,612,452 and 4,739,190 and accordingly, such details have been omitted herein for the sake of brevity.

The amplifier circuit OP may simply be an operational power amplifier having an inverting input to which the internal feedback networks of the amplifier are connected, these networks determining the direct current and alternating current gains, and a non-inverting input to which an audio signal to be amplified is supplied together with a DC voltage for the biasing of the output.

In the drawing figure, the block OP has an input terminal IN corresponding to a non-inverting operational amplifier input terminal which is connected via a first switch $SW_1$ to an audio signal source $V_{SIGN}$ and which is also connected to a biasing voltage generator $V_{DC}$.

Alternatively, there could also be a second input terminal for connection to the biasing voltage generator $V_{DC}$. The amplifier circuit OP is designed to output both the audio signal and the biasing voltage after amplification by respective predetermined gains.

The biasing voltage generator $V_{DC}$ is of the type in which the voltage generated depends on the charge state of a capacitor, since when the generator is activated, the value of this voltage increases gradually from zero to a predetermined constant value over a predetermined time interval, while the reverse takes place when the generator is deactivated.

The biasing circuit is connected to the first terminal +Vcc of the power supply via a second switch $SW_2$.

An audio amplifier in accordance with the present invention further comprises first $K_1$, second $K_2$ and third $K_3$ threshold comparators, each having first and second input terminals and an output terminal.

The first input terminal of each of these threshold comparators is connected to a common circuit node P which forms a control terminal for the audio amplifier.

A capacitor C is connected between the circuit node P and the second terminal −Vcc of the power supply.

The second input terminal of the comparator $K_1$, the second input terminal of the comparator $K_2$ and the second input terminal of the comparator $K_3$ are respectively connected to first $RV_1$, second $RV_2$ and third $RV_3$ voltage references.

The output terminals of the first, second and third threshold comparators are respectively connected to the first switch $SW_1$, to the biasing voltage generator $V_{DC}$ and to the second switch $SW_2$.

The switches are open when the threshold comparators connected thereto are not generating any output signal and are closed when the comparators are generating output signals.

The biasing voltage generator $V_{DC}$ is activated by the signals generated by the threshold comparator $K_2$ connected thereto and disabled by their discontinuation: the type of operation is the first type mentioned above.

The switch $SW_2$ can be used to enable or disable the supplying of power not only to the biasing circuit CM but also to other circuit components of the audio amplifier which are also disabled when the threshold comparator $K_3$ is not generating any output signal.

Alternatively, these circuit components could be supplied via different switches controlled, however, by the same threshold comparator $K_3$.

The problem of the noise arising from switching transients generated either upstream of the amplifier in other components of the audio apparatus or in the amplifier itself in its power output stage is solved in a simple but effective way in an audio amplifier in accordance with the present invention, which also enables the "mute" and "standby" functions in a very economic way.

The main characteristic feature of an audio amplifier in accordance with the present invention is that the "mute" and "standby" states are included among the obligatory physical states of a transition between a state of normal operation in which all the components of the amplifier are active and a cut-off state in which all the components are cut off.

A single control terminal, the circuit node P, allows the audio amplifier to be placed in a "mute" or "standby" state and simultaneously to act as an automatic control terminal in order to eliminate the adverse effects ("crackles") of the noise due to the switching transients.

The voltage reference $RV_1$, $RV_2$ and $RV_3$ are selected such that above a first predetermined potential value U1 at the common circuit node P there is normal operation of the audio amplifier in which all the components are active nd therefore the comparators each generate an output signal, as a result of which an audio signal coming from the signal source $V_{SIGN}$ is normally amplified and output.

These voltage references are also dimensioned so that for potential values at the node P which are lower than or equal to this value U1 and greater than a second predetermined potential value U2, which is lower than U1, the first threshold comparator $K_1$ is automatically disabled or cut off; for potential values at the circuit node P which are lower than or equal to this value U2 and greater than a third predetermined potential value U3, which is lower than U2, the second threshold comparator $K_2$ is also automatically disabled or cut off and finally for potential values at the circuit node P which are lower than or equal to this value U3, the third threshold comparator $K_3$ is also automatically disabled or cut off.

The potential value U3 is selected such that it is always greater than the "ground" potential value which the node P assumes when the audio amplifier is completely cut off, or when the supply is interrupted and all the capacitances of the circuit have been discharged.

The capacitor C connected between the node P and the second terminal $-Vcc$ of the power supply, or "ground terminal", ensures that all the potential variations at the node P take place gradually and continuously.

Even when a potential value at this node is set externally to bring about, as we will see, a "mute" or "standby" state, the actual potential evolves gradually and continuously to this set value which is reached in a time interval which is a function of the capacitance of the capacitor C.

It is precisely this gradual nature of the potential variations at the circuit node P which makes it possible to solve the problem of the noise caused by the switching transients effectively and with particularly simple circuit devices. By way of example, passage from a state of normal operation to the "mute" state will be examined.

By setting a predetermined potential value lower than or equal to the value U1 but greater than the value U2 at the node P, the actual potential value at the node P varies continuously until it is the desired value only after a time interval determined by the capacitance of the capacitor C, causing, as soon as this actual value becomes equal to U1, the deactivation of the comparator $K_1$ and the resultant opening of the switch $SW_1$.

The transfer of the audio signal via the amplifier circuit OP is thus prevented and the "mute" function provided.

It is important to note that an identical initial transition to the "mute" state also takes place during a cut off transient, since during this transient the potential at the node P tends in a non-abrupt way towards the same value as the ground potential and therefore necessarily also assumes the value U1 prior to cut off.

Since an audio apparatus normally comprises an appropriate capacitor (not shown) for the general reduction of the effects of an abrupt discontinuation of the power supply voltage on cut off, it is possible, by dimensioning the capacitance of the capacitor C appropriately with respect to the capacitance of the above-mentioned capacitor, to enable the "mute" state to be reached before the components upstream of the audio amplifier begin to generate noise due to the switching transients.

When this noise occurs it can no longer be amplified and converted into annoying acoustic noise ("crackles").

Similarly, during a turn-on transient, this noise is avoided by leaving the "mute" state only when the transients causing the noise upstream of the audio amplifier have died away.

Passage from the state of normal operation to the "standby" state will not be considered.

By setting a predetermined potential value lower than or equal to the value U3, but greater than the "ground" potential value, at the node P, the actual potential value at the node P varies continuously until it becomes the desired value only after a time interval determined by the capacitance of the capacitor C. In the first instance the comparator $K_1$ is disabled as soon as this actual potential value at the node P becomes equal to U1 and the switch $SW_1$ is consequently opened, with the "mute" state. The comparator $K_2$ is then disabled when the potential value at the node P drops to the value U2 as a result of which a progressive and gradual decrease to zero begins in the biasing voltage generated by the generator $V_{DC}$.

Finally, when the potential value at the node P is equal to U3, the comparator $K_3$ is also disabled, the switch $SW_2$ is opened and consequently at least the biasing circuit CM contained in the amplifier circuit OP is disabled, thereby bringing about the "standby" state since the power supply voltage has not been discontinued as in the case on cut off. The "mute" state also continues.

It is now possible to examine how the problem of the noise caused by instability during the switching of the power output stage of the amplifier circuit OP is solved in a particularly simple way.

As mentioned above, during a cut off transient, for instance, the potential at the node P varies continuously until it reaches the same value as the ground potential.

When the voltage has a value U1, the audio amplifier is placed in the "mute" state and is then, at the value U3, placed in the "standby" state, which does not exclude the "mute" state, until the "general" capacitor, discussed above, connected directly to the supply is also completely discharged.

However, before the audio amplifier is placed in the "standby" state, the comparator $K_2$ is disabled when the potential value at the node P is equal to U2.

When the comparator $K_2$ is no longer generating output signals, the deactivation of the biasing voltage generator $V_{DC}$ does not take place abruptly, but the supply of the biasing voltage is gradually reduced until this voltage is equal to zero over a predetermined period dimensioned such that the power output stage of the amplifier circuit OP is brought, with no instability in normal operation, to a minimum conduction level, or to cut off, before the threshold comparator $K_3$ is disabled and there is therefore switching to "standby" with the discontinuation of the supply to the biasing circuit means CM within the amplifier circuit OP.

In conclusion, the noise caused by instability of the power output stage due to the switching transients is automatically avoided both in the case in which a "standby" state is set and in the case of complete cut off of the amplifier.

Obviously any noise caused by instability of the output stage due to turn-on or to passage from a "standby" state to normal operation are similarly avoided as a result of the gradual increase in the conduction of the output stage after the reactivation of the comparator $K_2$ which can take place, however, only after the reactivation of the comparator $K_3$ which restores the power supply voltage to the biasing circuit CM.

In the illustrated embodiment, first $R_1$, second $R_2$ and third $R_3$ resistors are connected in parallel with the capacitor C between the circuit node P and the second terminal $-Vcc$ of the power supply. A constant current generator $I_{REF}$ is connected between the first terminal $+Vcc$ of the power supply and the circuit node P.

The resistors $R_2$ and $R_3$ are respectively connected to the terminal $-Vcc$ via a third switch $SW_3$ and a fourth switch $SW_4$.

During normal operation of the audio amplifier, the switches $SW_3$ and $SW_4$ are open and it is the voltage drop across the resistor $R_1$ which maintains the potential at the circuit node P at a value enabling the three threshold comparators to be active and to generate output signals.

The values of the three resistors $R_1$, $R_2$ and $R_3$ are dimensioned such that when the switch $SW_3$ is closed and the resistor $R_2$ is thus connected in parallel with the resistor $R_1$, the potential at the node P drops to a value bringing about, through the deactivation of the comparator $K_1$ alone, a "mute" state, while when the switch $SW_4$ (or both the switches $SW_3$ and $SW_4$) is closed and the resistor $F_3$ (or the resistors $R_2$ and $R_3$) drops to a value bringing about, through the deactivation of the comparators $K_2$ and $K_3$ as well, a "standby" state.

Although a single embodiment of the invention has been described and illustrated, it is evident that many variants are possible without departing from the scope of the invention.

I claim:

1. An audio amplifier comprising:
   an amplifier circuit means having at least one input terminal and an output terminal and including a bias circuit means;
   a signal source input means for receiving an input audio signal to be amplified by the audio amplifier, said signal source input means being coupled to said at least one input terminal of said amplifier circuit means;
   a control means having at least three states;
   a voltage generator means, coupled to said control means, and having an output terminal comprising a control node;
   a comparing means having an input terminal connected to said control node and having first, second and third output terminals;
   a bias voltage generator means having an input terminal coupled to said second output terminal of said voltage generator means and having an output terminal coupled to said at least one input terminal of said amplifier circuit means, said bias voltage generator means substantially integrating a potential at its input terminal such that a potential at its output terminal gradually changes to a value substantially proportional to that potential at its input terminal after a predetermined period of time;
   a supply voltage source means for providing a supply voltage to the audio amplifier;
   a first switch means for connecting said signal source input means and said at least one input terminal of said amplifier circuit means and having a control terminal connected to said first output terminal of said comparing means, said first switch means selectively connecting and disconnecting said signal source input means to said amplifier circuit means in accordance with a potential at its control terminal;
   a second switch means for connecting said supply voltage source means to said bias circuit means of said amplifier circuit means and having a control terminal connected to said third output terminal of said comparing means, said second switch means selectively connecting and disconnecting said supply voltage source means to said bias circuit means of said amplifier circuit means in accordance with a potential at its control terminal;
   wherein said at least three states of said control means includes a first, normal, state in which a first voltage potential is present at said first, second and third output terminals of said comparing means, such that said signal source input means is connected to said at least one input terminal of said amplifier circuit means via said first switch means and said supply voltage source means is connected to said bias circuit means of said amplifier circuit means via said second switch means and an output voltage is provided from said bias voltage generator means after a predetermined period of time; and
   wherein said at least three states of said control means includes a second, mute, state in which said second and third output terminals of said comparing means remain at said first potential while said first output terminal of said comparing means is at a second potential which is different from said first potential such that said first switch means disconnects said signal source input means from said at least one input terminal of said amplifier circuit means, thereby muting the amplifier; and
   wherein said at least three states of said control means includes a third, standby, state in which said first and second and third outputs of said comparing means are at said second potential, such that said signal source input means is disconnected from said at least one input of said amplifier circuit means by said first switch means and said supply voltage source means is disconnected from said bias circuit means of said amplifier circuit means by said second switch means and said bias voltage generator means changes said potential at its output terminal to a value proportional to said second potential after a predetermined period of time;

said voltage generator means and control means and comparing means being arranged such that transitions between said at least three states of said control means occur gradually.

2. An audio amplifier as recited in claim 1, wherein said control means comprises at least two switches, each of said switches having first and second operating positions and first and second terminals, each of said switches respectively selectively connecting said first and second terminals thereof in said first and second operating positions, said first state of said control means corresponding to both of said switches being in said first operating position and said second state of said control means corresponding to one of said two switches being in said second operating position and said third state of said control means corresponding to at least the other of said two switches being in said second operating position.

3. An audio amplifier as recited in claim 2, wherein said voltage generator means comprises a constant current source connected between said supply voltage source means and said control node and further comprising a plurality of resistances and a parallel connected capacitance connected between said supply voltage source means and said control node, wherein said control means selectively connects and disconnects ones of said plurality of resistors to thereby control the potential at said control node.

4. An audio amplifier as recited in claim 3, wherein said comparing means comprises at least three comparators arranged such that said first voltage potential is present at said first, second and third output terminals of said comparing means when a potential at said control node is greater than a first predetermined voltage value and said first output terminal of said comparing means is at said second potential while said second and third output terminals thereof are at said first potential when said potential at said control node is less than or equal to said first predetermined voltage value and greater than a second predetermined potential voltage which is less than said first predetermined voltage potential and wherein said first and second terminals of said comparing means are at said second potential while said third output terminal thereof is at said first potential when said potential at said control node is less than or equal to said second predetermined voltage potential and greater than a third predetermined voltage potential which is less than said second predetermined voltage potential and wherein said first and second and third output terminals of said comparing means are at said second potential when said potential at said control node is less than or equal to said third predetermined voltage potential and greater than zero volts.

5. An audio amplifier as recited in claim 3, wherein said bias voltage generator means comprises an integrator circuit having at least one resistive element and at least one capacitive element.

6. An audio amplifier as recited in claim 2, wherein said comparing means comprises at least three comparators arranged such that said first voltage potential is present at said first, second and third output terminals of said comparing means when a potential at said control node is greater than a first predetermined voltage value and said first output terminal of said comparing means is at said second potential while said second and third output terminals thereof are at said first potential when said potential at said control node is less than or equal to said first predetermined voltage value and greater than a second predetermined potential voltage which is less than said first predetermined voltage potential and wherein said first and second terminals of said comparing means are at said second potential while said third output terminal thereof is at said first potential when said potential at said control node is less than or equal to said second predetermined voltage potential and greater than a third predetermined voltage potential which is less than said second predetermined voltage potential and wherein said first and second and third output terminals of said comparing means are at said second potential when said potential at said control node is less than or equal to said third predetermined voltage potential and greater than zero volts.

7. An audio amplifier as recited in claim 2, wherein said bias voltage generator means comprises an integrator circuit having at least one resistive element and at least one capacitive element.

8. An audio amplifier as recited in claim 1, wherein said comparing means comprises at least three comparators arranged such that said first voltage potential is present at said first, second and third output terminals of said comparing means when a potential at said control node is greater than a first predetermined voltage value and said first output terminal of said comparing means is at said second potential while said second and third output terminals thereof are at said first potential when said potential at said control node is less than or equal to said first predetermined voltage value and greater than a second predetermined potential voltage which is less than said first predetermined voltage potential and wherein said first and second terminals of said comparing means are at said second potential while said third output terminal thereof is at said first potential when said potential at said control node is less than or equal to said second predetermined voltage potential and greater than a third predetermined voltage potential which is less than said second predetermined voltage potential and wherein said first and second and third output terminals of said comparing means are at said second potential when said potential at said control node is less than or equal to said third predetermined voltage potential and greater than zero volts.

9. An audio amplifier as recited in claim 8, wherein said bias voltage generator means comprises an integrator circuit having at least one resistive element and at least one capacitive element.

10. An audio amplifier as recited in claim 1, wherein said bias voltage generator means comprises an integrator circuit having at least one resistive element and at least one capacitive element.

11. An audio amplifier comprising an amplifier circuit which has at least one input terminal for connection via a first switch to a signal source and for connection to a biasing voltage generator of the type in which the voltage generated depends on the charge condition of a capacitor, and at least one output terminal for connection to a load and comprises an output stage connected between a first and a second terminal of a supply voltage generator, and biasing circuit means for the biasing of at least this output state, these means also being connected between the first and second terminal of the supply voltage generator, the amplifier comprising a first, a second and a third threshold comparator, each having a first and a second input terminal and an output terminal, the first input terminal of each of these threshold comparators being connected to the first input terminal of the other threshold comparators in a common circuit node, designed to be a third control terminal, connected to the second terminal of the supply voltage generator via a capacitor, the second input terminal of the first threshold comparator, the second input terminal of the second threshold comparator and the second input terminal of the third threshold comparator being connected to a first, a second and a third voltage reference, respectively, the output terminal of the first threshold comparator, the output terminal of the second threshold comparator and the output terminal of the third threshold comparator being respectively connected to the first switch, to the biasing voltage generator and to a second switch, connected in series with the biasing circuit means between the first and the second terminal of the supply voltage generator, these first and second switches and this biasing voltage generator being controlled by the first, the third and the second threshold comparator, respectively.

12. An audio amplifier as claimed in claim 11, wherein the first voltage reference is selected such that the first threshold comparator generates a control signal for the closure of the first switch only for potential values at the circuit node which are greater than a first predetermined value, the second voltage reference is selected such that the second threshold comparator generates a control signal for the activation of the biasing voltage generator only for potential values at the circuit node which are greater than a second predetermined value, lower than the first predetermined value, and the third voltage reference is selected such that the third threshold comparator generates a control signal for the closure of the second switch only for potential values at the circuit node which are greater than a third predetermined value which is lower than the second predetermined value and greater than the potential value at the second terminal of the supply voltage generator.

* * * * *